(12) United States Patent
Miyata et al.

(10) Patent No.: US 10,700,487 B2
(45) Date of Patent: Jun. 30, 2020

(54) LIGHT SOURCE DEVICE (71) Applicant: NICHIA CORPORATION, Anan-shi, Tokushima (JP)

(72) Inventors: Tadaaki Miyata, Yokohama (JP); Yoshihiro Kimura, Yokohama (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/939,219

(22) Filed: Mar. 28, 2018

(65) Prior Publication Data

US 2018/0287334 A1    Oct. 4, 2018

(30) Foreign Application Priority Data

Mar. 29, 2017 (JP) ................... 2017-064414

(51) Int. Cl.
*H01S 5/00* (2006.01)
*H01S 5/02* (2006.01)
(Continued)

(52) U.S. Cl.
CPC ........ *H01S 5/02208* (2013.01); *H01S 5/0215* (2013.01); *H01S 5/02216* (2013.01); *H01S 5/02248* (2013.01); *H01S 5/02276* (2013.01); *H01S 5/02292* (2013.01); *H01S 5/221* (2013.01); *H01S 5/4087* (2013.01); *H01S 5/0071* (2013.01); *H01S 5/02296* (2013.01)

(58) Field of Classification Search
CPC ............... H01S 5/02208; H01S 5/0071; H01S 5/02216; H01S 5/00; H01S 5/02; H01S 5/022; H01S 5/40; H01S 5/02292; H01S 5/02248; H01S 5/4087; H04N 1/0316
USPC ........................................................ 372/43.01
See application file for complete search history.

(56) References Cited

U.S. PATENT DOCUMENTS 9,008,139 B2\* 4/2015 Monadgemi ........ H01S 5/02292
372/44.01
2007/0071049 A1    3/2007 Kohara et al.
(Continued)

FOREIGN PATENT DOCUMENTS

JP    2005317646 A    11/2005
JP    2007027716 A    2/2007
(Continued)

*Primary Examiner* — Tuan N Nguyen
(74) *Attorney, Agent, or Firm* — Hunton Andrews Kurth LLP (57) ABSTRACT

Provided is a light source device, including: a base member; a semiconductor laser disposed on the base member; a lateral wall portion formed so as to surround the semiconductor laser; a light-transmissive lid covering a gap surrounded by the base member and the lateral wall portion; and a connection member that airtightly connects an upper surface of the lateral wall portion and a lower surface of the lid over an entire perimeter of the lateral wall portion. The lateral wall portion has a reflecting surface which is an inside surface connected to an upper surface, the reflecting surface being inclined so that light emitted from the semiconductor laser is reflected toward the lid. A dielectric film is continuously formed on the reflecting surface and the upper surface. A height of the connection member is greater than a height of the dielectric film formed on the upper surface.

25 Claims, 6 Drawing Sheets

(51) Int. Cl.
 *H01S 5/22* (2006.01)
 *H01S 5/022* (2006.01)
 *H01S 5/40* (2006.01)

(56) References Cited

U.S. PATENT DOCUMENTS

| | | |
|---|---|---|
| 2007/0091945 A1 | 4/2007 | Ferstl |
| 2011/0158273 A1 | 6/2011 | Okayama et al. |
| 2011/0280270 A1 | 11/2011 | Hayashi |
| 2012/0033695 A1 | 2/2012 | Hayashi et al. |
| 2013/0022069 A1* | 1/2013 | Lee .................... H01S 5/02292 372/38.02 |
| 2013/0214298 A1* | 8/2013 | Lin ......................... H01L 33/60 257/88 |
| 2015/0003482 A1* | 1/2015 | Monadgemi ........ H01S 5/02292 372/44.01 |

FOREIGN PATENT DOCUMENTS

| | | | |
|---|---|---|---|
| JP | 2007-080988 | * 3/2007 | ............. H01S 5/022 |
| JP | 2007080988 A | 3/2007 | |
| JP | 2010165613 A | 7/2010 | |
| JP | 2011114006 A | 6/2011 | |
| JP | 2011138953 A | 7/2011 | |
| JP | 2011181794 A | 9/2011 | |
| JP | 2011204888 | * 10/2011 | ................ F21S 2/20 |
| JP | 2011204888 A | 10/2011 | |
| JP | 2012038819 A | 2/2012 | |
| JP | 2012054527 A | 3/2012 | |
| WO | 2011108038 A1 | 9/2011 | |
| WO | 2011117934 A1 | 9/2011 | |

* cited by examiner

LIGHT SOURCE DEVICE

CROSS-REFERENCE TO RELATED APPLICATION

The present application claims priority to Japanese Patent Application No. 2017-064414, filed on Mar. 29, 2017, the disclosure of which is hereby incorporated by reference in its entirety.

BACKGROUND

1. Technical Field

The present disclosure relates to a light source device, and particularly to a light source device including a semiconductor laser.

2. Description of Related Art

As a light source device including a semiconductor laser, a light source device has been proposed which has a reflecting surface inclined with respect to a base member surface provided with a semiconductor laser, and substantially vertically reflects light emitted from the semiconductor laser (see, for example, JP 2010-165613 A).

In the light source device described in JP 2010-165613 A, an inclined surface formed on a base member is provided with a reflecting film composed of a metal film or a dielectric film by sputtering or vapor deposition, so that a reflecting surface is formed. Further, the reflecting film extends not only over the inclined surface of the base member, but also to the upper surface of the base member, and therefore the inclined surface including an upper end portion thereof can be reliably used as a reflecting surface, so that the reflectivity can be improved.

In a light source device having such an inclined reflecting surface, it is desired to airtightly enclose a semiconductor laser in a package by bonding a light-transmissive lid to the upper surface of a base member. However, in the light source device described in JP 2010-165613 A, the upper surface of the base member and the lower surface of the lid cannot be appropriately bonded because the light reflecting film is formed even on the upper surface of the base member. On the other hand, when the light reflecting film is prevented from being formed on the upper surface of the base member in order to bond the base member and the lid, there is the problem that the position of the end portion varies depending on formation accuracy of the light reflecting film, and thus a region where the light reflecting film is not formed is generated in the vicinity of the upper end of the inclined surface, leading to a reduction in light reflectivity.

SUMMARY

The present disclosure has been made in view of the problems described above, and an object of the present disclosure is to provide a light source device which is capable of airtightly enclosing a semiconductor laser in a package by a light-transmissive lid and which has a reflecting surface with a high reflectivity at which light emitted from the semiconductor laser is reflected toward the lid.

For achieving the object described above, a light source device according to an aspect of the present disclosure includes: a base member; a semiconductor laser disposed on the base member; a lateral wall portion formed so as to surround the semiconductor laser; a light-transmissive lid covering a gap surrounded by the base member and the lateral wall portion; and a connection member that airtightly connects an upper surface of the lateral wall portion and a lower surface of the lid over an entire perimeter of the lateral wall portion. The lateral wall portion has a reflecting surface which is an inside surface connected to the upper surface, the reflecting surface being inclined so that light emitted from the semiconductor laser is reflected toward the lid. A dielectric film is continuously formed on the reflecting surface and the upper surface. A height of the connection member is greater than a height of the dielectric film formed on the upper surface.

According to the aspect described above, there can be provided a light source device which is capable of airtightly enclosing a semiconductor laser in a package by a light-transmissive lid and which has a reflecting surface with a high reflectivity at which light emitted from the semiconductor laser is reflected toward the lid.

DETAILED DESCRIPTION OF EMBODIMENTS

Hereinafter, various embodiments for carrying out the present disclosure will be described with reference to the drawings. In the drawings, corresponding members having the same function are given the same symbol. In consideration of ease of explaining or understanding the main point, embodiments will be shown separately for the sake of convenience, but configurations shown in different embodiments can be partially replaced or combined. In second and subsequent embodiments, description of the same matters as in a first embodiment will be omitted, and only different matters will be described. Particularly, like effects by like configurations will not be mentioned one by one for each embodiment.

The following descriptions are based on the premise that a base member is mounted on a horizontal surface, and the base member and a lid are disposed on the lower side and on the upper side, respectively.

(Light Source Device According to an Embodiment)

Figure 1:
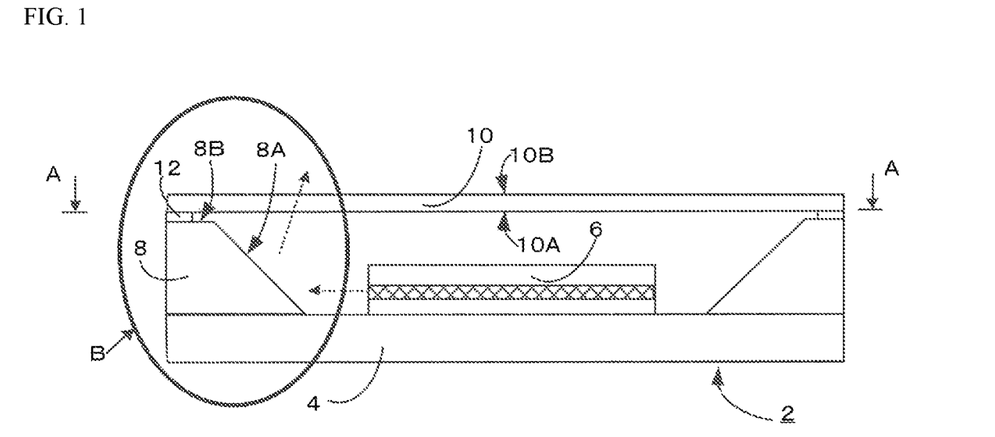
FIG. 1 is a schematic side sectional view showing an outline of a light source device according to an embodiment of the present disclosure.
Figure 2:
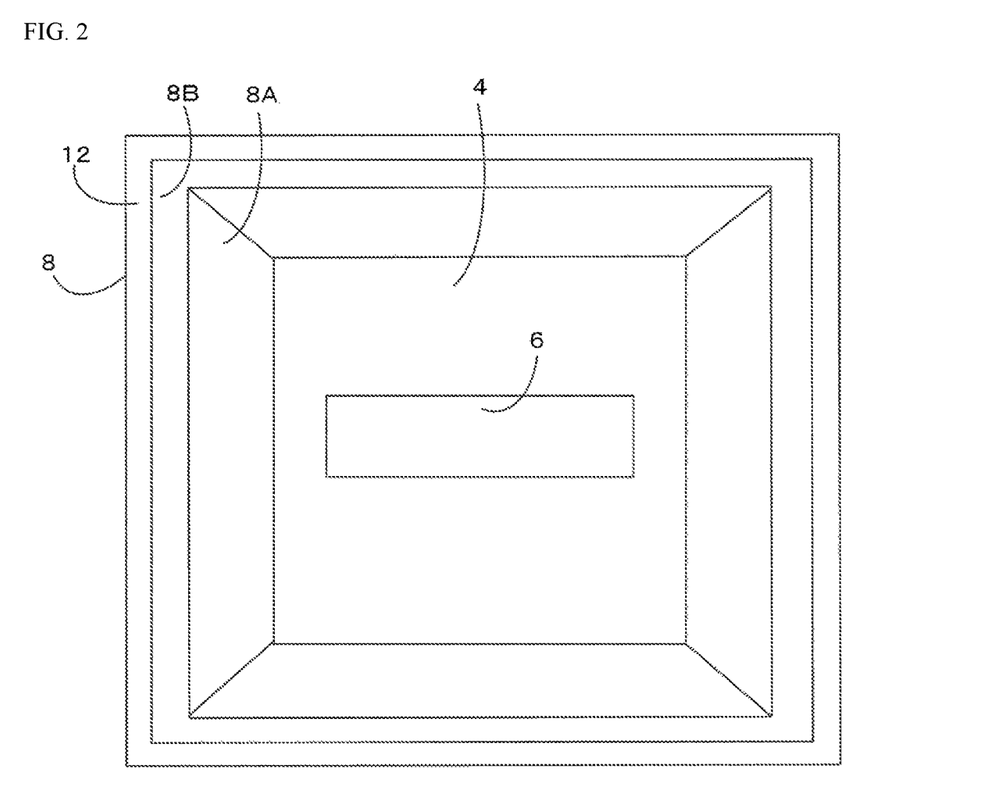
FIG. 2 is a view (plan view) taken along a line between arrows A in FIG. 1.

First, an outline of a light source device according to an embodiment of the present disclosure will be described with reference to FIGS. 1 and 2. FIG. 1 is a schematic side sectional view showing an outline of the light source device according to an embodiment of the present disclosure. FIG. 2 is a view (plan view) taken along a line between arrows A in FIG. 1.

A light source device 2 according to this embodiment includes a base member 4, a semiconductor laser 6 disposed on the base member 4, a lateral wall portion 8 formed so as to surround the semiconductor laser 6, and a light-transmissive lid 10 covering a gap surrounded by the base member 4 and the lateral wall portion 8. The lateral wall portion 8 has a reflecting surface which is an inside surface 8A connected to an upper surface 8B, the reflecting surface being inclined so that light emitted from the semiconductor laser 6 is reflected toward the lid 10 (see dotted line arrows in FIG. 1). As described later, a metal film is formed on the inside surface 8A, and this forms a reflecting surface. The light reflected toward the lid 10 means reflected light that travels in any direction including a vertically upward vector component directed to the lid.

A connection member 12 for airtightly connecting the upper surface 8B of the lateral wall portion 8 and a lower surface 10A of the lid 10 is disposed over an entire perimeter of the upper surface 8B of the lateral wall portion 8. The base member 4 and the lateral wall portion 8 are airtightly bonded to each other, and the semiconductor laser 6 mounted in a package including the base member 4 and the lateral wall portion 8 can be airtightly enclosed by the lid 10.

As shown in FIG. 2, in plan view where the package is viewed from above, the base member 4 that forms the package has a substantially rectangular shape, and the lateral wall portion 8 is provided with four inside surfaces 8A that form a recess portion, in which the semiconductor laser 6 is enclosed, with the base member 4. Four upper edges forming boundaries between the inside surfaces 8A and the upper surface 8B of the lateral wall portion 8 form a substantially rectangular shape. Similarly, four lower edges forming boundaries between the inside surfaces 8A of the lateral wall portion 8 and the base member 4 form a substantially rectangular shape. Accordingly, the base member 4 and the four inside surfaces (reflecting surfaces) 8A of the lateral wall portion 8 form a substantially quadrangular pyramid-shaped recess portion which is narrower on the lower side, i.e. a substantially quadrangular pyramid-shaped recess portion in which the lower edge is shorter than the upper edge.

With this structure, the lateral wall portion 8 also serves as a part of the package, and it is unnecessary to specially use a raising mirror etc., so that the light source device can be downsized.

In this embodiment, the base member 4 and the four inside surfaces 8A of the lateral wall portion 8 form a substantially quadrangular pyramid-shaped recess portion, but the present disclosure is not limited thereto, and the recess portion may have a trigonal pyramid shape, any polygonal pyramid shape having five or more angles, or a cone shape. In this embodiment, the lateral wall portion 8 is formed on the outer edge side of the base member 4, and the outer shape of the base member 4 is coincident with the outer shape of the lateral wall portion 8, but the present disclosure is not limited thereto. The base member 4 may extend further to the outside of the outer shape of the lateral wall portion 8 as long as the lateral wall portion 8 is formed so as to surround the semiconductor laser 6. A plurality of lateral wall portions 8 may be formed on one base member 4.

In this embodiment, the base member 4 and the lateral wall portion 8 are formed of individual members, and therefore an optimal material can be employed according to a use of each of the members. In this embodiment, aluminum nitride is used as a material of the base member 4. However, the material of the base member 4 is not limited thereto, and other ceramic materials such as alumina, alumina-zirconia and silicon nitride, resin materials, single crystals of silicon and the like, metallic materials provided with an insulating layer, and the like can also be used.

In this embodiment, silicon is used as a material of the lateral wall portion 8. Here, the angle of the inside surface 8A can be defined by the crystal orientation of silicon, and therefore a reflecting surface having a correct inclination angle can be easily formed. For example, when the (100) surface of single crystal silicon is etched by anisotropic etching, a (111) surface having an angle of 54.7° appears, and this surface can be defined as the inside surface 8A.

Thus, in this embodiment, the lateral wall portion 8 is formed of silicon, and therefore a reflecting surface having a desired inclination angle can be formed with high accuracy. However, the material of the lateral wall portion 8 is not limited to silicon, and resin materials, other ceramic materials, glass and the like can also be used.

In this embodiment, light-transmissive glass is used as a material of the light-transmissive lid, but the material of the light-transmissive lid is not limited thereto, and quartz, sapphire and the like can also be used.

In this embodiment, aluminum or an aluminum alloy is used as a material of the connection member 12. However, the material of the connection member 12 is not limited thereto, and other metallic materials such as titanium, resin materials, ceramic materials, eutectic crystal materials and the like can also be used. When a metallic material is used, the inside surface can be used as an auxiliary reflecting surface.

In this embodiment, a nitride semiconductor laser is used as the semiconductor laser 6, and the emission wavelength is a wavelength of ultraviolet light to green light. However, the present disclosure is not limited thereto, and a red or infrared semiconductor laser can also be used.

(Bonding Structure of Lid According to First Embodiment)

Figure 3:
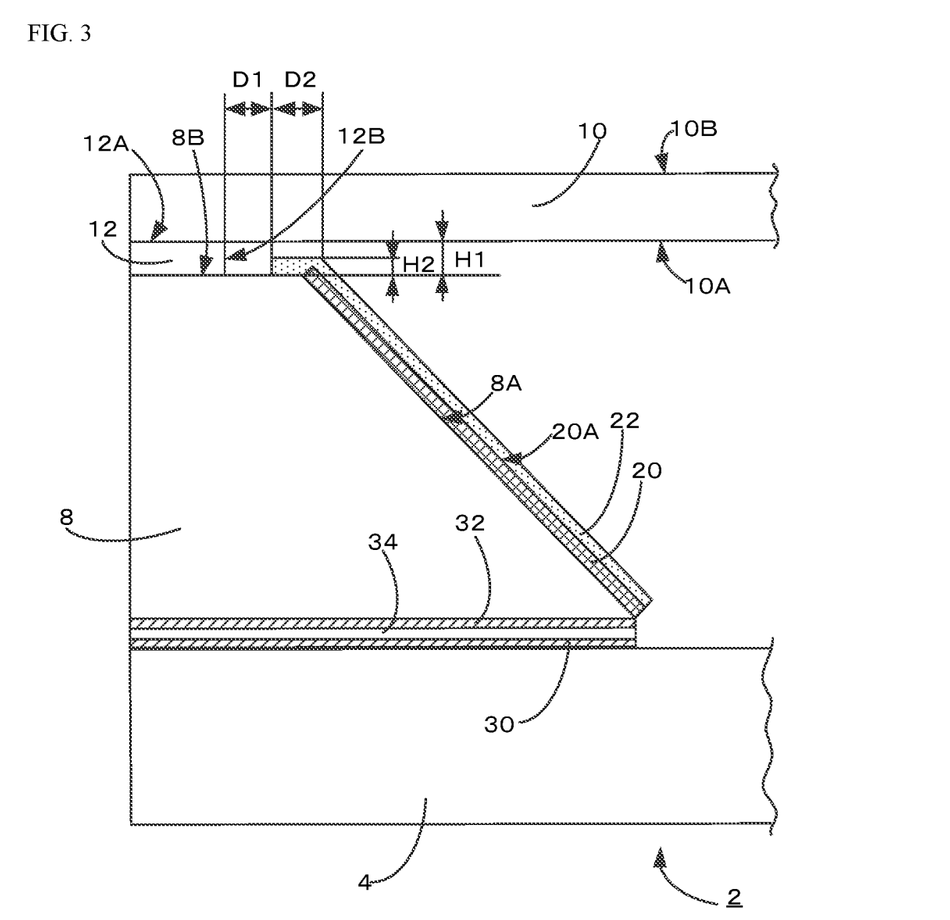
FIG. 3 is a side sectional view showing an enlarged region shown by symbol B in FIG. 1, and shows a bonding structure of a lid according to a first embodiment of the present disclosure.

A bonding structure of the lid according to the first embodiment of the present disclosure will now be described with reference to FIG. 3. FIG. 3 is a side sectional view showing an enlarged region shown by symbol B in FIG. 1, and shows the bonding structure of the lid according to the first embodiment of the present disclosure. When compared to FIG. 1, FIG. 3 further shows bonding films 30 and 32 and a metallic bonding material which are formed for airtightly bonding the base member 4 and the lateral wall portion 8, and a reflecting film 20 and a dielectric film 22 which are formed for causing the inside surface 8A of the lateral wall portion 8 to serve as a reflecting surface.

<Bonding of Base Member and Lateral Wall Portion>

The bonding films 30 and 32 may have a layered structure of different metal films. For example, for bonding the base member 4 and the lateral wall portion 8, a region of the upper surface of the base member 4 to which the lateral wall portion 8 is attached is provided with the bonding film 30 which includes a base layer including a first layer composed of a film containing any of titanium (Ti), nickel (Ni) and chromium (Cr) and a second layer containing platinum (Pt) (there may be a case where the second layer is not present), and a third layer (bonding layer) situated on the base layer and composed of a film containing gold (Au).

Similarly, the lower surface of the lateral wall portion 8 is provided with the bonding film 32 which may include a base layer including a first layer composed of a film containing any of titanium (Ti), nickel (Ni) and chromium (Cr) and a second layer containing platinum (Pt) (there may be a case where the second layer is not present), and a third layer (bonding layer) situated on the base layer and composed of a film containing gold (Au).

The thickness of each of the bonding films 30 and 32 may be, for example, about 0.3 to 2 μm.

The bonding film 30 formed on the base member 4 side and the bonding film 32 formed on the lateral wall portion 8 side are bonded with molten metal using a metallic bonding material (lead-free solder) 34 composed of tin (Sn), silver (Ag) or copper (Cu). Accordingly, the base member 4 and the lateral wall portion 8 can be airtightly and firmly bonded. Gold-tin (Au—Sn) or other solder material can also be used as the metallic bonding material 34.

<Reflecting Film>

The inside surface 8A of the lateral wall portion 8 is provided with the reflecting film 20 which may include a base layer including a first layer composed of a film containing any of titanium (Ti), nickel (Ni) and chromium (Cr) and a second layer including a film containing platinum (Pt) (there may be a case where the second layer is not present), and a third layer (reflecting layer) situated on the base layer and composed of a film containing silver (Ag). That is, the outer surface of the reflecting film 20 formed on the inside surface 8A of the lateral wall portion 8 is a reflecting surface 20A. The thickness of the reflecting film 20 may be, for example, about 0.3 to 2 μm.

In this embodiment, a film containing silver is formed as the reflecting film 20, and therefore the reflecting surface 20A with a high reflectivity is obtained. However, the third layer that forms the reflecting surface is not limited to a metal film containing silver (Ag), and for example, a metal film containing aluminum (Al) can be used.

Further, the dielectric film 22 including silicon dioxide ($SiO_2$), titanium dioxide ($TiO_2$) or the like is formed on the reflecting surface 20A of the reflecting film 20. The dielectric film 22 may be a single layer, or may be a multilayer film in which layers giving different refractive indices are stacked. By appropriately selecting materials to be stacked and a thickness, the dielectric film 22 can be made to function as an excellent reflecting film, or made to function as an excellent antireflection film (non-reflection film). Here, the reflectivity of the reflecting surface can be effectively increased by the dielectric film 22 functioning as a reflecting film.

When the dielectric film 22 is formed on the reflecting surface, normally the dielectric film 22 is formed by sputtering or vapor deposition with a mask applied to a dielectric film-non-formed region by printing or the like. Here, there is a limit to accuracy with which the mask is formed by printing or the like, and the position of the end portion of the formed mask varies. Accordingly, if the dielectric film 22 is formed even on the upper end portion of the reflecting surface 20A, which is a boundary between the inside surface 8A and the upper surface 8B of the lateral wall portion 8, a region where the dielectric film 22 is not formed may be generated in the vicinity of the upper end of the reflecting surface 20A due to a variation in position of the end portion of the mask. Accordingly, there is the problem that the reflectivity of the reflecting surface 20A cannot be sufficiently increased.

Thus, in this embodiment, the dielectric film 22 is formed not only on the reflecting surface 20A of the lateral wall portion 8 (region of the inside surface 8A), but also on the upper surface 8B of the lateral wall portion 8 continuously, as illustrated in FIG. 3. When a length D2 of the dielectric film 22 extending to the upper surface 8B of the lateral wall portion 8 is set larger than a range of variation during formation of the mask, always the dielectric film 22 can be formed on the whole reflecting surface 20A (region of the inside surface 8A) to reliably increase the reflectivity of the reflecting surface. More specifically, the length D2 of the dielectric film 22 extending to the upper surface 8B of the lateral wall portion 8 means a distance between the outside end portion of the dielectric film 22 and the inside end portion that is a boundary between the dielectric film 22 and the reflecting surface 20A (region of the inside surface 8A). Hereinafter, the length D2 is referred to as a distance D2.

<Bonding of Lateral Wall Portion and Lid>

Bonding of the upper surface 8B of the lateral wall portion 8 and the lower surface 10A of the lid 10 will now be described.

In this embodiment, by sputtering or vapor deposition, the connection member 12 composed of aluminum or an aluminum alloy is formed on a region of the upper surface 8B of the lateral wall portion 8 where the dielectric film 22 is not formed. The upper surface of the formed connection member 12 and the lower surface 10A of the lid 10 are bonded by anodic bonding.

In anodic bonding, glass and metal or glass and silicon are brought into contact with each other, and heated while a predetermined voltage is applied therebetween with the metal set to an anode, whereby bonding is performed. By the anodic bonding, materials having considerably different natures, such as glass and metal, can be bonded without use of an inclusion such as solder or an adhesive. Bonding can be performed by anodic bonding using titanium or a titanium alloy in place of aluminum or an aluminum alloy as a material of the connection member 12.

As described above, the connection member 12 and the lid 10 can be bonded by anodic bonding, and therefore airtight firm bonding is possible.

<Height of Connection Member>

As described above, the dielectric film 22 is continuously formed on the reflecting surface 20A (region of the inside surface 8A) and the upper surface 8B, and therefore the dielectric film 22 may be in contact with the lower surface 10A of the lid 10. If the dielectric film 22 is in contact with the lid 10, the connection member 12 and the lid 10 cannot be appropriately bonded by anodic bonding.

Thus, in this embodiment, a height (dimension) H1 of the connection member 12 is greater than a height (dimension) H2 of the dielectric film 22 formed on the upper surface 8B of the lateral wall portion 8 as shown in FIG. 3. That is, the heights H1 and H2 satisfy the relationship of H1>H2.

As described above, in this embodiment, the dielectric film 22 is continuously formed on the reflecting surface 20A (region of the inside surface 8A) and the upper surface 8B, and therefore the dielectric film 22 can be reliably formed on the whole reflecting surface 20A (region of the inside surface 8A), so that the reflecting surface 20A (region of the inside surface 8A) having a high reflectivity is obtained. In addition, the height (dimension) H1 of the connection member 12 is greater than the height (dimension) H2 of the dielectric film 22 formed on the upper surface 8B, and therefore only the connection member 12 is in contact with the lid 10, so that a bonding structure with high airtightness is reliably obtained.

The height (dimension) H2 corresponding to the thickness of the dielectric film 22 formed on the upper surface 8B may vary to some extent, but it is necessary to ensure that only the connection member 12 is reliably in contact with the lid 10 even when the height (dimension) H2 somewhat varies. For meeting this requirement, the height (dimension) H1 of the connection member 12 is preferably within a range of 1.5 to 2.5 times, more preferably within a range of 1.8 to 2.2 times of the height (dimension) H2 of the dielectric film 22 formed on the upper surface 8B.

If the height (dimension) H2 of the dielectric film 22 formed on the upper surface 8B is 0.4 to 1.0 the height (dimension) H1 of the connection member 12 may be preferably about 0.6 to 2.5 µm.

When the height (dimension) H1 of the connection member 12 is within a range of 1.5 to 2.5 times of the height (dimension) H2 of the dielectric film 22, a structure in which only the connection member 12 is in contact with the lid 10 can be reliably formed even when the height (dimension) H2 of the dielectric film 22 varies. Accordingly, a bonding structure with high airtightness is reliably obtained.

A height gap shown by "H1-H2" is generated between the upper end of the dielectric film 22 formed on the upper surface 8B and the lower surface 10A of the lid 10, and thus light emitted from the semiconductor laser 6 may enter the gap. In this embodiment, however, an inside surface 12B of the connection member 12 is composed of aluminum or an aluminum alloy and may function as an auxiliary reflecting surface.

In this embodiment, the inside surface 12B of the connection member 12 may function as an auxiliary reflecting surface as described above, and therefore a structure in which a reflecting surface extends to immediately below the lid 10 is achieved, so that light extraction efficiency can be improved. Particularly, in this embodiment, since the connection member 12 is composed of aluminum or an aluminum alloy, firm connection with high airtightness can be made possible by anodic bonding, and a function as an auxiliary reflecting surface can be obtained.

<Distance Between Connection Member and Dielectric Film>

This embodiment will be described further in detail with reference to FIG. 3. A distance D1 is provided between the inside surface 12B of the connection member 12 and the outside end portion of the dielectric film 22 formed on the upper surface 8B of the lateral wall portion 8. That is, in plan view from above, over the entire perimeter of the lateral wall portion 8, a predetermined distance (D1) may be provided between the inside surface 12B of the connection member 12 and the outside end portion of the dielectric film 22 formed on the upper surface 8B.

As described above, the position of the outside end portion of the dielectric film 22 formed on the upper surface 8B varies, but in this embodiment, the distance D1 is provided between the inside surface 12B of the connection member 12 and the outside end portion of the dielectric film 22 formed on the upper surface 8B, and therefore even when the position of the outside end portion of the dielectric film 22 formed on the upper surface 8B varies, the connection member 12 can be reliably disposed on the upper surface 8B of the lateral wall portion 8 without interference with the dielectric film 22.

The distance D2 of the dielectric film 22 formed on the upper surface 8B may vary to some extent, but it is necessary to reliably dispose the connection member 12 on the upper surface 8B of the lateral wall portion 8 without interference with the dielectric film 22 even when the distance D2 somewhat varies. For meeting this requirement, the distance D1 is preferably within a range of 0.5 to 2 times, more preferably within a range of 0.8 to 1.5 times of the distance D2 between the outside end portion of the dielectric film 22 formed on the upper surface 8B and the inside end portion that is a boundary with the reflecting surface 20A (region of the inside surface 8A).

If the distance D2 of the dielectric film 22 is about 0.8 to 2 µm the distance D1 may be preferably about 0.4 to 4 µm.

When the distance D1 between the inside surface 12B of the connection member 12 and the outside end portion of the dielectric film 22 is within a range of 0.5 to 2 times of the distance D2 between the outside end portion of the dielectric film 22 formed on the upper surface 8B and the inside end portion as described above, the connection member 12 can be reliably disposed on the upper surface 8B of the lateral wall portion 8 without interference with the dielectric film 22 even if the distance D2 of the dielectric film 22 formed on the upper surface 8B varies.

(Description of Bonding Structure of Lid According to Second Embodiment)

Figure 4:
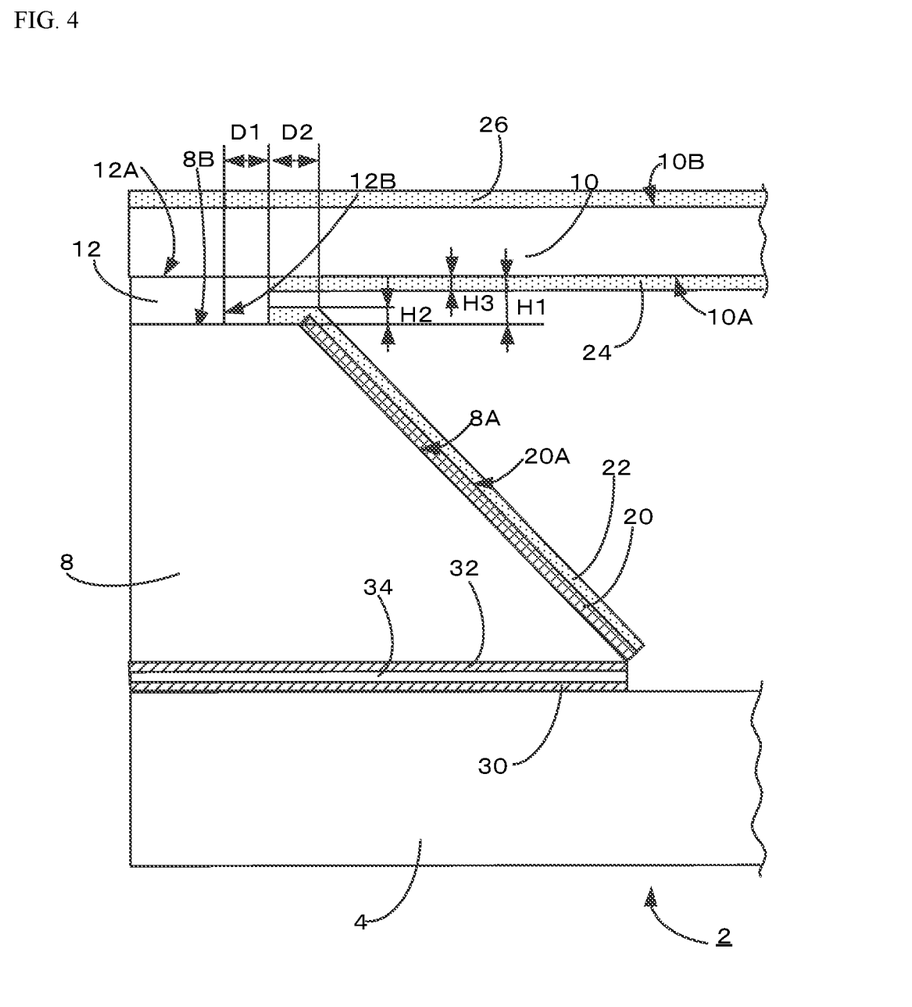
FIG. 4 is a side sectional view showing an enlarged region shown by symbol B in FIG. 1, and shows a bonding structure of a lid according to a second embodiment of the present disclosure.

A bonding structure of a lid according to a second embodiment of the present disclosure will now be described with reference to FIG. 4. FIG. 4 is a side sectional view showing an enlarged region shown by symbol B in FIG. 1, and shows the bonding structure of the lid according to the second embodiment of the present disclosure.

This embodiment is different from the first embodiment shown in FIG. 3 in that further, a dielectric film 24 which functions as an antireflection film is formed on a lower surface 10A of a lid 10 excluding a region which is in contact with a connection member 12. By applying a mask during formation of the dielectric film 24, a distance D1 is provided between the outside end portion of the dielectric film 24 and an inside surface 12B of the connection member 12. However, the distance between the outside end portion of the dielectric film 24 and the inside surface 12B of the connection member 12 can be different from the distance D1 according to a variation in position of the end portion of the mask that is formed. If the distance between the outside end portion of the dielectric film 24 and the inside surface 12B of the connection member 12 is larger than D1, considering the antireflection function in the lid 10, the distance is preferably smaller than D1+D2. In FIG. 4, a dielectric film 26 that functions as an antireflection film is also formed on an upper surface 10B of the lid 10, but there may be a case where the dielectric film is formed only on the lower surface 10A of the lid 10.

By appropriately selecting materials to be stacked, and a thickness, reflection of the upper and lower surfaces 10A and 10B of the lid 10 can be suppressed by the dielectric films 24 and 26, so that extraction efficiency of light emitted from the lid 10 can be improved.

The dielectric film 24 is formed on the lower surface 10A of the lid 10 excluding a region that is in contact with the connection member 12, and even in this case, a height (dimension) H1 of the connection member 12 is greater than the total of a height (dimension) H2 of the dielectric film 22 formed on an upper surface 8B of a lateral wall portion 8 and a height (dimension) H3 of the dielectric film 24 formed on the lower surface 10A of the lid 10. That is, the heights H1, H2 and H3 satisfy the relationship of H1>H2+H3.

In this embodiment, the dielectric film 24 that functions as an antireflection film is formed on at least the lower surface 10A of the lid 10, and therefore light extraction efficiency from the upper surface 10B of the lid 10 can be improved. In addition, the height (dimension) H1 of the connection member 12 is greater than the total of the height (dimension) H2 of the dielectric film 22 formed on the upper surface 8B of the lateral wall portion 8 and the height (dimension) H3 of the dielectric film 24 formed on the lower surface 10A of the lid 10, and therefore only the connection member 12 is in contact with the lid 10, so that a bonding structure with high airtightness is reliably obtained.

The height (dimension) H2 of the dielectric film 22 formed on the upper surface 8B and the height (dimension) H3 of the dielectric film 24 formed on the lower surface 10A of the lid 10 may vary to some extent, but it is necessary to ensure that only the connection member 12 is reliably in contact with the lid 10 even when the heights (dimensions) H2 and H3 somewhat vary. For meeting this requirement, the height (dimension) H1 of the connection member 12 is preferably within a range of 1.5 to 2.5 times, more preferably within a range of 1.8 to 2.2 times of the total of the height (dimension) H2 of the dielectric film 22 formed on the upper surface 8B and the height (dimension) H3 of the dielectric film 24 formed on the lower surface 10A of the lid 10.

If each of the height (dimension) H2 of the dielectric film 22 formed on the upper surface 8B and the height (dimension) H3 of the dielectric film 24 formed on the lower surface 10A of the lid 10 is about 0.4 to 1 μm, the height (dimension) H1 of the connection member 12 may be preferably about 1.2 to 5 μm.

When the height (dimension) H1 of the connection member 12 is within a range of 1.5 to 2.5 times of the total of the height (dimension) H2 of the dielectric film 22 formed on the upper surface 8B and the height (dimension) H3 of the dielectric film 24 formed on the lower surface 10A of the lid 10 as described above, a structure in which only the connection member 12 is reliably in contact with the lid 10 can be formed even when the heights (dimensions) of the dielectric films 22 and 24 vary. Accordingly, a bonding structure with high airtightness is reliably obtained.

The second embodiment is otherwise the same as the first embodiment, and therefore further descriptions thereof are omitted.

(Description of Bonding Structure of Lid According to Third Embodiment)

Figure 5:
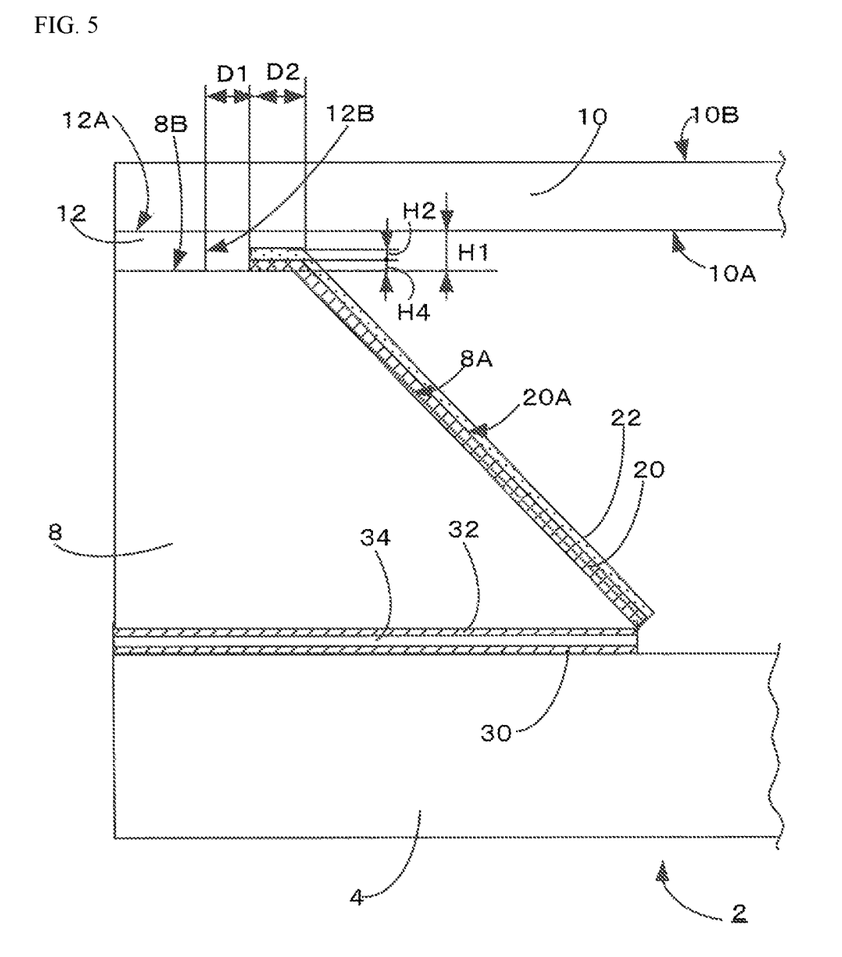
FIG. 5 is a side sectional view showing an enlarged region shown by symbol B in FIG. 1, and shows a bonding structure of a lid according to a third embodiment of the present disclosure.

A bonding structure of a lid according to a third embodiment of the present disclosure will now be described with reference to FIG. 5. FIG. 5 is a side sectional view showing an enlarged region shown by symbol B in FIG. 1, and shows the bonding structure of the lid according to the third embodiment of the present disclosure.

This embodiment is different from the first embodiment shown in FIG. 3 in that a reflecting film 20 formed on an inside surface 8A of a lateral wall portion 8 is formed not only on the inside surface 8A of the lateral wall portion 8, but also on an upper surface 8B of the lateral wall portion 8 continuously. Accordingly, the reflecting film 20 can be reliably formed on the whole inside surface 8A of the lateral wall portion 8, and therefore the reflectivity of a reflecting surface 20A can be improved.

Here, assume that the reflecting film 20 formed on the upper surface 8B of the lateral wall portion 8 has a height (dimension) H4, and a dielectric film 22 formed on the reflecting film 20 has a height (dimension) H2. A height (dimension) H1 of a connection member 12 is greater than the total of the height (dimension) H4 of the reflecting film 20 formed on the upper surface 8B of the lateral wall portion 8 and the height (dimension) H2 of the dielectric film 22 formed on the reflecting film 20. That is, the heights H1, H2 and H4 satisfy the relationship of H1>H2+H4.

In this embodiment, the reflecting film 20 is continuously formed even on the upper surface 8B of the lateral wall portion 8, and therefore the reflectivity of the reflecting surface 20A (region of the inside surface 8A) can be improved. In addition, the height (dimension) H1 of the connection member 12 is greater than the total of the height (dimension) H4 of the reflecting surface 20 formed on the upper surface 8B of the lateral wall portion 8 and the height (dimension) H2 of the dielectric film 22 formed on the reflecting film 20, and therefore only the connection member 12 is in contact with the lid 10, so that a bonding structure with high airtightness is reliably obtained.

Further, the second embodiment may be combined with this embodiment. Specifically, there may be a case where in this embodiment, further a dielectric film 24 that functions as an antireflection film is formed on the lower surface 10A of the lid 10 excluding a region that is in contact with the connection member 12. Here, assume that the dielectric film 24 formed on the lower surface 10A of the lid 10 has a height (dimension) H3, the height (dimension) H1 of the connection member 12 is greater than the total of the height (dimension) H4 of the reflecting film 20 formed on the upper surface 8B of the lateral wall portion 8, the height (dimension) H2 of the dielectric film 22 formed on the reflecting film 20, and the height (dimension) H3 of the dielectric film 24 formed on the lower surface 10A of the lid 10. That is, the heights H1, H2, H3 and H4 satisfy the relationship of H1>H2+H3+H4. Accordingly, only the connection member 12 is in contact with the lid 10, so that a bonding structure with high airtightness is reliably obtained.

(Method of Manufacturing Light Source Device)

An example of a method of manufacturing a light source device according to the present disclosure will now be described with reference to FIGS. 6A to 6E. FIGS. 6A to 6E are schematic views showing operations in an example of the method of manufacturing a light source device according to the present disclosure. Hereinafter, the method will be described taking as an example a case where the light source device has the bonding structure of the lid according to the first embodiment as shown in FIG. 3.

Figure 6A:
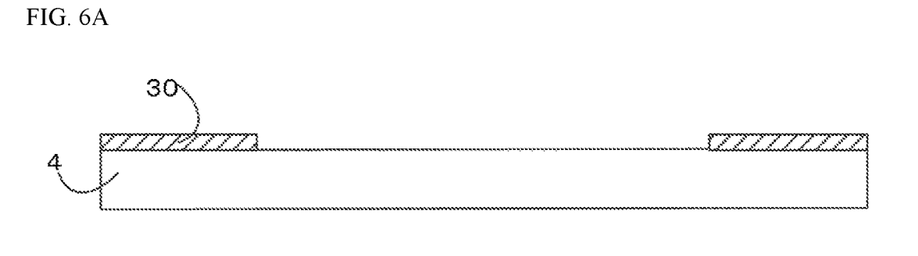
FIG. 6A is a schematic view showing an operation in an example of a method of manufacturing a light source device according to the present disclosure.

As shown in FIG. 6A, a base member composed of nitride aluminum is patterned to provide a base member 4 having a wiring layer that is electrically connected to a positive electrode and a negative electrode of a semiconductor laser. The base member 4 provided with a wiring layer may be purchased and used. A mask is applied to a region excluding a lateral wall portion 8-attached region of the base member 4, and by sputtering or vapor deposition, a first layer composed of a film containing titanium (Ti) or the like is formed, a second layer composed of a film containing platinum (Pt) is stacked on the first layer, and a third layer composed of a film containing gold (Au) is stacked on the second layer. Accordingly, a bonding film 30 including a base layer including the first layer and the second layer, and the third layer that is a bonding layer can be formed.

However, the method of forming the bonding film 30 is not limited to the above-mentioned process, and by sputtering or vapor deposition, only the third layer composed of a film containing gold (Au) may be formed on the first layer without forming the second layer as a base layer.

Figure 6B:
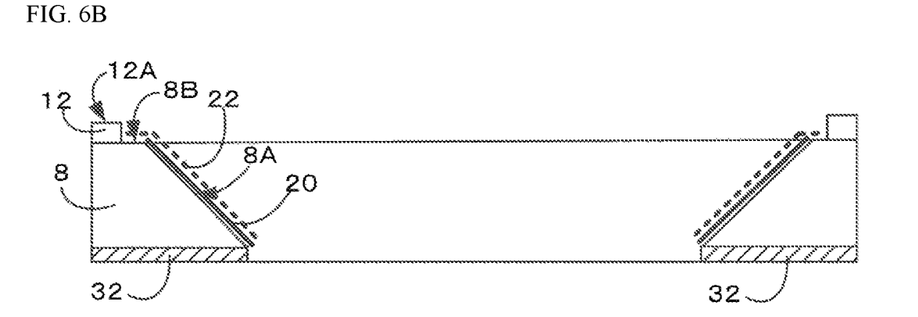
FIG. 6B is a schematic view showing an operation in an example of a method of manufacturing a light source device according to the present disclosure.

Next, as shown in FIG. 6B, the lateral wall portion 8 having an inclined inside surface 8A is provided by anisotropic etching of silicon. A lateral wall portion provided with an inclined inside surface may be purchased and used. A mask is applied to a region excluding the inside surface 8A of the lateral wall portion 8, and by sputtering or vapor deposition, a first layer composed of a film containing titanium (Ti) or the like is formed, a second layer composed of a film containing platinum (Pt) is stacked on the first layer, and a third layer composed of a film containing silver (Ag) is stacked on the second layer. Accordingly, a reflecting film 20 including a base layer including the first layer and the second layer, and the third layer that is a reflecting layer can be formed.

However, the method of forming the reflecting film 20 is not limited to the above-mentioned process, and by sputtering or vapor deposition, only the third layer composed of a film containing silver (Ag) may be formed on the first layer without forming the second layer as a base layer.

Further, a mask is applied to a region excluding the inside surface 8A of the lateral wall portion 8 and a part of an upper surface 8B extending continuously from the inside surface 8A, and by sputtering or vapor deposition, a dielectric film is formed. Accordingly, a dielectric film 22 for improving the reflectivity can be continuously formed on the reflecting film 20 formed on the inside surface 8A of the lateral wall portion 8, and the upper surface 8B of the lateral wall portion 8.

Further, a mask is applied to a region excluding the lower surface of the lateral wall portion 8, and by sputtering or vapor deposition, a first layer composed of a film containing titanium (Ti) or the like is formed, a second layer composed of a film containing platinum (Pt) is stacked on the first layer, and a third layer composed of a film containing gold (Au) is stacked on the second layer. Accordingly, a bonding film 32 including a base layer including the first layer and the second layer, and the third layer that is a bonding layer can be formed on the lower surface of the lateral wall portion 8.

However, the method of forming the bonding film 32 is not limited to the above-mentioned process, and by sputtering or vapor deposition, only the third layer composed of a film containing gold (Au) may be formed directly on the lower surface of the lateral wall portion 8 without forming the second layer as a base layer.

Further, a mask is applied to a region excluding a connection member-attached region of the upper surface 8B of the lateral wall portion 8, and by sputtering or vapor deposition, a connection member 12 composed of aluminum or an aluminum alloy is formed. Accordingly, the connection member 12 can be formed on the upper surface 8B of the lateral wall portion 8.

The method of forming the connection member 12 is not limited to the above-mentioned process, and as in the case of the process for preparing the bonding films 30 and 32, a base layer may be formed on the upper surface 8B of the lateral wall portion 8, followed by forming the connection member 12 on the base layer.

Figure 6C:
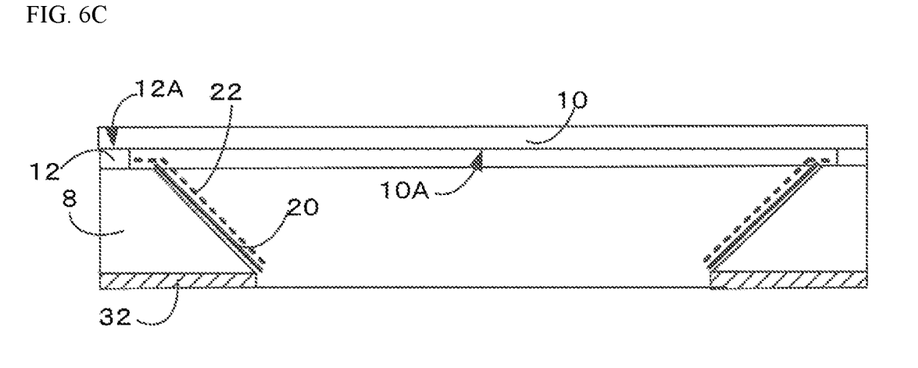
FIG. 6C is a schematic view showing an operation in an example of a method of manufacturing a light source device according to the present disclosure.

Next, as shown in FIG. 6C, a lid 10 composed of glass is provided, and an upper surface 12A of the connection member 12 formed on the lateral wall portion 8 and a lower surface 10A of the lid 10 are brought into contact with each other, and heated while a predetermined voltage is applied therebetween with the connection member 12 set to an anode, whereby anodic bonding is performed. Accordingly, bonding structure of the connection member 12 and the lid 10 with high airtightness is obtained.

Figure 6D:
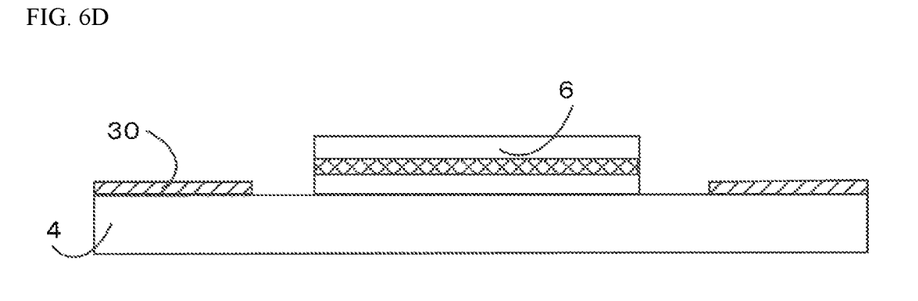
FIG. 6D is a schematic view showing an operation in an example of a method of manufacturing a light source device according to the present disclosure.

Next, as shown in FIG. 6D, a semiconductor laser 6 is mounted on the base member 4 in this package. As an example of a mounting method, an n-electrode on the bottom surface side of the semiconductor laser 6 and a wiring layer provided on the base member 4 are bonded with a bonding member such as a bump interposed therebetween, and a p-electrode on the upper surface side of the semiconductor laser 6 and the wiring layer provided on the base member 4 are bonded with a wire. In addition, as another example, the semiconductor laser 6 having an n-electrode and a p-electrode on the same surface side is used, where both the n-electrode and the p-electrode are bonded to the wiring layer with a bonding member interposed therebetween.

The semiconductor laser 6 can also be mounted on the base member 4 with a sub-mount interposed therebetween. The sub-mount is typically a material having high electric insulation quality and high thermal conductivity. Examples thereof include aluminum nitride and silicon carbide.

Figure 6E:
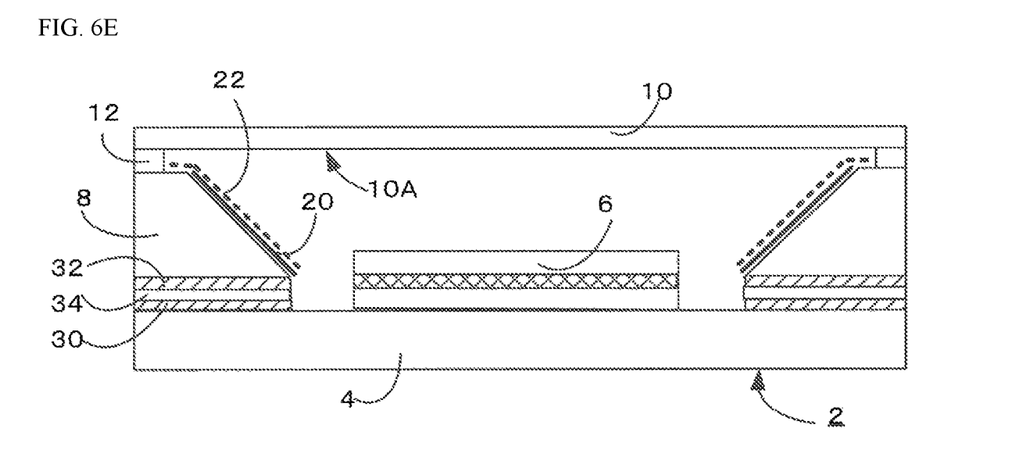
FIG. 6E is a schematic view showing an operation in an example of a method of manufacturing a light source device according to the present disclosure.

Next, as shown in FIG. 6E, the bonding surface of the bonding film 30 formed on the base member 4 and the bonding surface of the bonding film 32 formed on the lower surface of the lateral wall portion 8 are bonded to each other with molten metal using, for example, a metallic bonding material 34 composed of tin (Sn), silver (Ag), copper (Cu) or gold (Au). Accordingly, a bonding structure of the base member 4 and the lateral wall portion 8 with high airtightness is obtained using the metallic bonding material 34.

The bonding can be performed not only by a bonding process using the metallic bonding material 34 but also by diffusion bonding by, for example, heating and pressurizing the bonding surface of the bonding film 30 and the bonding surface of the bonding film 32.

By the above manufacturing process, a light source device 2 with the semiconductor laser 6 airtightly enclosed in a package as shown in FIG. 1 can be manufactured.

The operation shown in FIG. 6D can be carried out at any time separately from the operations in FIGS. 6B and 6C as long as the operation in FIG. 6D is carried out after the operation shown in FIG. 6A and before the operation shown in FIG. 6E. Further, the order of the operations in the above-mentioned manufacturing process can be arbitrarily changed. Here, it is preferable to determine the order of the operations so that a material with a higher melting point is attached earlier for ensuring that a material in a preceding operation is not melted in a subsequent operation.

Other Embodiments

The foregoing embodiments are each described with one light source device as an example, but a plurality of base members 4 and lateral wall portions 8 may be manufactured in a connected state, and divided at appropriate locations. Accordingly, a plurality of light source devices can be efficiently manufactured.

In the foregoing embodiments, the base member 4 and the lateral wall portion 8 are formed of different members, but the present disclosure is not limited thereto, and a package member in which a base member and a lateral wall portion are integrally formed can also be used.

In the foregoing embodiments, the connection member 12 and the lid 10 are bonded by anodic bonding, but the present disclosure is not limited thereto, and other bonding means such as welding, soldering and adhesion can also be used. Here, as a material of the connection member 12, a metallic material other than aluminum or titanium, a resin material, a ceramic material or the like can be used.

A photodiode or a Zener diode may be enclosed in a recess portion in which the semiconductor laser 6 is enclosed.

While the embodiments and implementations of the present disclosure have been described, the disclosure may be changed in details of the configuration, and a change and the like of the combination and order of elements in the embodiments and implementations can be made without departing from the scope and spirit of the present disclosure.

DENOTATION OF REFERENCE NUMERALS

2 Light source device
4 Base member
6 Semiconductor laser
7 Lateral wall portion
8A Inside surface
8B Upper surface
10 Lid
10A Lower surface
10B Upper surface
12 Connection member
12A Upper surface
12B Inside surface
20 Reflecting film
20A Reflecting surface
22 Dielectric film
24 Dielectric film
26 Dielectric film
30 Bonding film
32 Bonding film
34 Metallic bonding material

What is claimed is:

1. A light source device comprising:
a base member;
a semiconductor laser disposed on the base member;
a lateral wall portion formed so as to surround the semiconductor laser;
a light-transmissive lid covering a gap surrounded by the base member and the lateral wall portion; and
a connection member formed on a part of the upper surface of the lateral wall portion, and that airtightly connects an upper surface of the lateral wall portion and a lower surface of the lid over an entire perimeter of the lateral wall portion, wherein
the lateral wall portion has a reflecting surface which is an inside surface connected to the upper surface, the reflecting surface being inclined so that light emitted from the semiconductor laser is reflected toward the lid,
a first dielectric film is continuously formed on the reflecting surface and another part of the upper surface of the lateral wall portion,
a predetermined distance is provided between an inside surface of the connection member and an outside end portion of the first dielectric film formed on the upper surface of the lateral wall portion, and the predetermined distance is within a range of 0.5 to 2 times of a distance between the outside end portion of the first dielectric film formed on the upper surface of the lateral wall portion and an inside end portion of the first dielectric film that is a boundary with the reflecting surface, and
a height of the connection member is greater than a height of the first dielectric film formed on the upper surface of the lateral wall portion so that the first dielectric film does not contact with the lid.

2. The light source device according to claim 1, wherein the height of the connection member is within a range of 1.5 to 2.5 times of the height of the first dielectric film formed on the upper surface of the lateral wall portion.

3. The light source device according to claim 1, wherein a second dielectric film is formed on the lower surface of the lid excluding a region that is in contact with the connection member, and
the height of the connection member is greater than the total of the height of the first dielectric film formed on the upper surface of the lateral wall portion and the height of the second dielectric film formed on the lower surface of the lid.

4. The light source device according to claim 3, wherein the height of the connection member is within a range of 1.5 to 2 times of the total of the height of the first dielectric film formed on the upper surface of the lateral wall portion and the height of the second dielectric film formed on the lower surface of the lid.

5. The light source device according to claim 1, wherein an inside surface of the connection member functions as an auxiliary reflecting surface.

6. The light source device according to claim 1, wherein the connection member and the lid are bonded by anodic bonding.

7. The light source device according to claim 1, wherein a film containing silver is formed on the reflecting surface of the first dielectric film.

8. The light source device according to claim 1, wherein the lateral wall portion includes silicon.

9. The light source device according to claim 1, wherein the connection member is formed only on the upper surface of the lateral wall portion.

10. The light source device according to claim 1, wherein the connection member includes aluminum or an aluminum alloy.

11. A light source device comprising:
a base member;
a semiconductor laser disposed on the base member;
a lateral wall portion formed so as to surround the semiconductor laser;
a light-transmissive lid covering a gap surrounded by the base member and the lateral wall portion; and
a connection member formed on a part of the upper surface of the lateral wall portion, and that airtightly connects an upper surface of the lateral wall portion and a lower surface of the lid over an entire perimeter of the lateral wall portion, wherein
the lateral wall portion has a reflecting surface which is an inside surface connected to the upper surface, the reflecting surface being inclined so that light emitted from the semiconductor laser is reflected toward the lid,
a first dielectric film is continuously formed on the reflecting surface and another part of the upper surface of the lateral wall portion,
a predetermined distance is provided between an inside surface of the connection member and an outside end portion of the first dielectric film formed on the upper surface of the lateral wall portion, and the predetermined distance is within a range of 0.5 to 2 times of a distance between the outside end portion of the first dielectric film formed on the upper surface of the lateral wall portion and an inside end portion of the first dielectric film that is a boundary with the reflecting surface, and
a height of the connection member is greater than a height of the first dielectric film formed on the upper surface of the lateral wall portion so that the first dielectric film does not contact with the lid, and the connection member exists only on the upper surface of the lateral wall portion and the connection member does not cover the semiconductor laser.

12. The light source device according to claim 11, wherein the height of the connection member is within a range of 1.5 to 2.5 times of the height of the first dielectric film formed on the upper surface of the lateral wall portion.

13. The light source device according to claim 11, wherein a second dielectric film is formed on the lower surface of the lid excluding a region that is in contact with the connection member, and the height of the connection member is greater than the total of the height of the first dielectric film formed on the upper surface of the lateral wall portion and the height of the second dielectric film formed on the lower surface of the lid.

14. The light source device according to claim 13, wherein the height of the connection member is within a range of 1.5 to 2 times of the total of the height of the first dielectric film formed on the upper surface of the lateral wall portion and the height of the second dielectric film formed on the lower surface of the lid.

15. The light source device according to claim 11, wherein the connection member includes aluminum or an aluminum alloy.

16. The light source device according to claim 11, wherein the connection member and the lid are bonded by anodic bonding.

17. The light source device according to claim 11, wherein a film containing silver is formed on the reflecting surface of the first dielectric film.

18. The light source device according to claim 11, wherein the lateral wall portion includes silicon.

19. A light source device comprising:
a base member;
a semiconductor laser disposed on the base member;
a lateral wall portion formed so as to surround the semiconductor laser;
a light-transmissive lid covering a gap surrounded by the base member and the lateral wall portion; and
a connection member formed on a part of the upper surface of the lateral wall portion, and that airtightly connects an upper surface of the lateral wall portion and a lower surface of the lid over an entire perimeter of the lateral wall portion, wherein
the lateral wall portion has a reflecting surface which is an inside surface connected to the upper surface, the reflecting surface being inclined so that light emitted from the semiconductor laser is reflected toward the lid,
a first dielectric film is continuously formed on the reflecting surface and another part of the upper surface of the lateral wall portion,
a predetermined distance is provided between an inside surface of the connection member and an outside end portion of the first dielectric film formed on the upper surface of the lateral wall portion, and the predetermined distance is within a range of 0.5 to 2 times of a distance between the outside end portion of the first dielectric film formed on the upper surface of the lateral wall portion and an inside end portion of the first dielectric film that is a boundary with the reflecting surface, and
a height of the connection member is greater than a height of the first dielectric film formed on the upper surface of the lateral wall portion so that the first dielectric film does not contact with the lid,
a second dielectric film is formed on the lower surface of the lid excluding a region that is in contact with the connection member, and
the height of the connection member is greater than the total of the height of the first dielectric film formed on the upper surface of the lateral wall portion and the height of the second dielectric film formed on the lower surface of the lid.

20. The light source device according to claim 19, wherein the height of the connection member is within a range of 1.5 to 2 times of the total of the height of the first dielectric film formed on the upper surface of the lateral wall portion and the height of the second dielectric film formed on the lower surface of the lid.

21. The light source device according to claim 19, wherein an inside surface of the connection member functions as an auxiliary reflecting surface.

22. The light source device according to claim 21, wherein the connection member includes aluminum or an aluminum alloy.

23. The light source device according to claim 19, wherein the connection member and the lid are bonded by anodic bonding.

24. The light source device according to claim 19, wherein a film containing silver is formed on the reflecting surface of the first dielectric film.

25. The light source device according to claim 19, wherein the lateral wall portion includes silicon.

* * * * *